United States Patent

Ito

[11] Patent Number: 6,080,238
[45] Date of Patent: Jun. 27, 2000

[54] SINGLE CRYSTAL PULLING METHOD

[75] Inventor: Makoto Ito, Amagasaki, Japan

[73] Assignee: Sumitomo Sitix Corporation, Hyogo, Japan

[21] Appl. No.: 09/144,650

[22] Filed: Aug. 31, 1998

[51] Int. Cl.$^7$ .................................................. C30B 15/20
[52] U.S. Cl. ............................... 117/30; 117/31; 117/217
[58] Field of Search ................................. 117/30, 31, 217

[56] References Cited

U.S. PATENT DOCUMENTS

| | | | |
|---|---|---|---|
| 5,363,796 | 11/1994 | Kobayashi et al. | 117/30 |
| 5,766,347 | 6/1998 | Shimomura et al. | 117/217 |
| 5,853,480 | 12/1998 | Kubota et al. | 117/217 |

FOREIGN PATENT DOCUMENTS

| | | |
|---|---|---|
| 5-139879 | 6/1993 | Japan . |
| 9-263484 | 10/1997 | Japan . |

OTHER PUBLICATIONS

"Single Crystal Growing Apparatus," Electronic Material, Extra Issue, Makoto Ito et al., Dec. 1995.

*Primary Examiner*—Felisa Hiteshew
*Attorney, Agent, or Firm*—Arent Fox Kintner Plotkin & Kahn, PLLC

[57] ABSTRACT

After whole raw material filled in a crucible is melted by plural heaters provided around the crucible, outputs of the heaters are lowered so that molten liquid is maintained at a predetermined temperature. A seed crystal is brought into contact with a surface of the molten liquid, and while a height of the surface of the molten liquid is being maintained in a heating region of a topmost heater, a pulling shaft is pulled up at a predetermined speed so that a single crystal is grown in a lower position of the seed crystal. At this time, in order that the pulled single crystal has required oxygen concentration during the pulling of the single crystal, a ratio of the output of the topmost heater to the outputs of all the heaters is set to a value calculated by $R_{PW} \geq 0.88 R_T$ ($R_{PW}$: output ratio of the topmost heater) based on the ratio $R_T$ of the height of the topmost heater to the height of the crucible.

9 Claims, 5 Drawing Sheets

SINGLE CRYSTAL PULLING METHOD

BACKGROUND OF THE INVENTION

1. Field of the Invention

The present invention relates to a method of pulling up a single crystal used for producing a semiconductor wafer.

2. Description of the Prior Art

FIG. 1 is a side sectional view showing a main section of a single crystal pulling apparatus. In the drawing, 50 is a metallic chamber. The chamber 50 is arranged so that a cylindrical pull chamber 51 is connected with a main chamber 52 of wide-mouthed bottle type. A crucible 31 for melting raw material is positioned in a center of the main chamber 52. The crucible 31 is arranged so that an outer container 33 made of graphite, which has a similar figure to an inner container 32, is fitted to the inner container 32 which is made of quartz and is arranged so that a bowl-shaped lower section is provided to a lower end of a cylindrical drum section. The crucible 31 is rotated and is raised/lowered by a supporting member 35 which is made of graphite and has thermal conductivity approximately same as that of the outer container 33.

Drum-shaped heaters 36 and 37 of resistance heating type are provided on the outside of the crucible 31 so as to be separated from each other in an up-and-down direction and to be on a coaxial circle about the crucible 31. The heights of the heaters 36 and 37 are equal. The heaters 36 and 37 and the crucible 31 are stored in an adiabatic container 40 having a cylindrical shell shape. A hole whose diameter is slightly larger than that of the crucible 31 is provided onto an upper surface of the adiabatic container 40, and a hole whose diameter is slightly larger than that of an axis of the supporting member 35 is provided onto a bottom surface of the adiabatic container 40. The supporting member 35 penetrates the hole provided onto the bottom surface of the adiabatic container 40 and a bottom of the main chamber 52, and the supporting member 35 is connected with a rotary elevator, not shown. Meanwhile, a bar-shaped or wire-shaped pulling shaft 44 is hung from a central axis of the pull chamber 51 so as to be freely raised/lowered and rotated, and a seed crystal 45 is attached to a lower end of the pulling shaft 44.

In order to pull up a single crystal by such an apparatus, the outputs of the heaters 36 and 37 are made to be maximum so as to melt the raw material in the crucible 31, and molten liquid L is obtained. Then, after the outputs of the heaters 36 and 37 are lowered to the same value and the temperature of molten liquid L is lowered to a predetermined value, the seed crystal 45 is brought into contact with the surface of the molten liquid L. While the pulling shaft 44 and supporting member 35 are being rotated respectively in directions opposite to each other, the pulling shaft 44 is pulled up at a predetermined speed, and thus single crystal 46 is grown at a lower position of the seed crystal 45. At this time, as the molten liquid L is reduced by pulling of the single crystal 46, the crucible 31 is raised by the supporting member 35, and the height of the surface of the molten liquid L is maintained approximately constant. When the lower surface of the crucible 31 becomes higher than the upper end of the lower heater 37, the output of the heater 37 is made to be 0.

However, in the conventional single crystal pulling method, the pulled single crystal has a lot of portions where interstitial oxygen concentration is higher than a target value. As for a wafer, which is cut out from a portion where the oxygen concentration in the single crystal is high, at the time of heat treatment, oxygen in the crystal is separated and a defect easily occurs on its surface. Therefore, the wafer cannot be used as a product having required specification, and thus the yields are low. This is, as described in "Single Crystal Growing Apparatus, 'Electronic Material, Extra Issue' published in December, 1995", because the oxygen concentration in the single crystal is determined mainly by an amount of oxygen eluted from an inner wall of the bottom of the crucible into the molten liquid, but in the conventional method, the elution of oxygen from the inner wall of the bottom of the crucible cannot be restricted.

In order to solve this problem, the magnetic field applying Czochralski method has been developed. In this method, a magnetic field applying apparatus for applying a magnetic field is provided on the outside of the main chamber, and while a magnetic field is being applied to molten liquid in a crucible, single crystal is pulled up. However, when using the magnetic field applying Czochralski method, since the magnetic field applying apparatus should be installed, the cost of the apparatus is high and an outer dimension of the pulling apparatus is large. For this reason, there arises a problem such that a floor space of a clean room for storing the pulling apparatus becomes large or the number of the pulling apparatuses to be installed in the clean room is decreased.

BRIEF SUMMARY OF THE INVENTION

It is a main object of the present invention to provide a single crystal pulling method which can control an amount of oxygen eluted from the bottom of a crucible without applying a magnetic field and can obtain single crystal in which a portion having target oxygen concentration has high yield.

In a single crystal pulling method of the present invention, when single crystal is pulled up from molten liquid of raw material for single crystal with a height of a surface of molten liquid being maintained in a heating region of a topmost heater by using an apparatus where plural heaters for heating a crucible which contains the molten liquid are provided in an up-and-down direction, a ratio of an output of the topmost heater to outputs of all the heaters during pulling of single crystal is set to a value which is not less than a value obtained by multiplying a ratio of a dimension of the topmost heater in the up-and-down direction to a dimension of the crucible in the up-and-down direction by 0.88.

In the present invention, an amount of oxygen eluted from a bottom portion of the crucible can be controlled easily, and in the pulled single crystal, a ratio of a portion having desired oxygen concentration is high, and thus the yields per single crystal become higher.

The above and further objects and features of the invention will more fully be apparent from the following detailed description with accompanying drawings.

DETAILED DESCRIPTION OF THE INVENTION

First, a general idea of the present invention is described.

Figure 1:
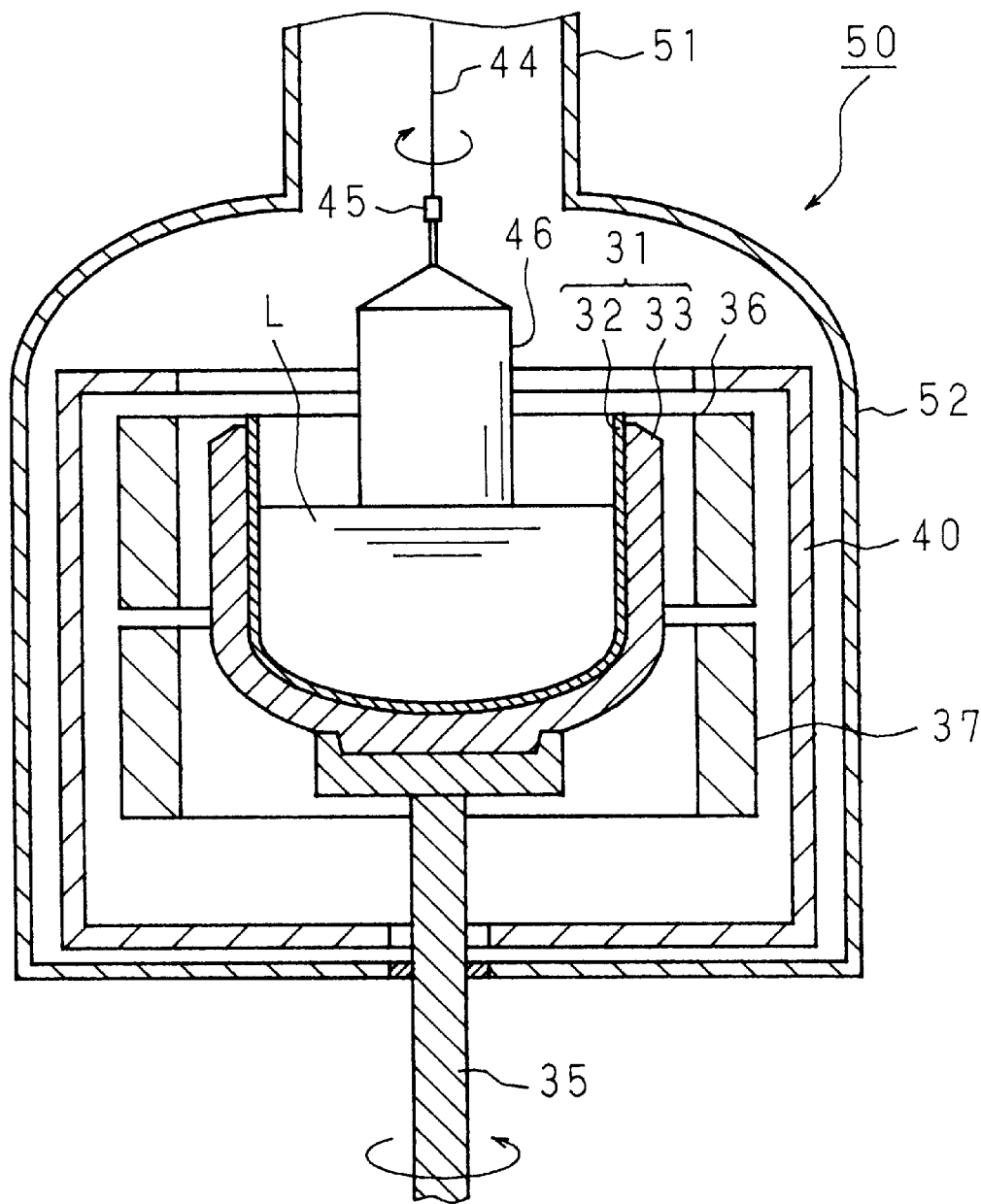
FIG. 1 is a side sectional view showing a main section of a single crystal pulling apparatus.
Figure 2:
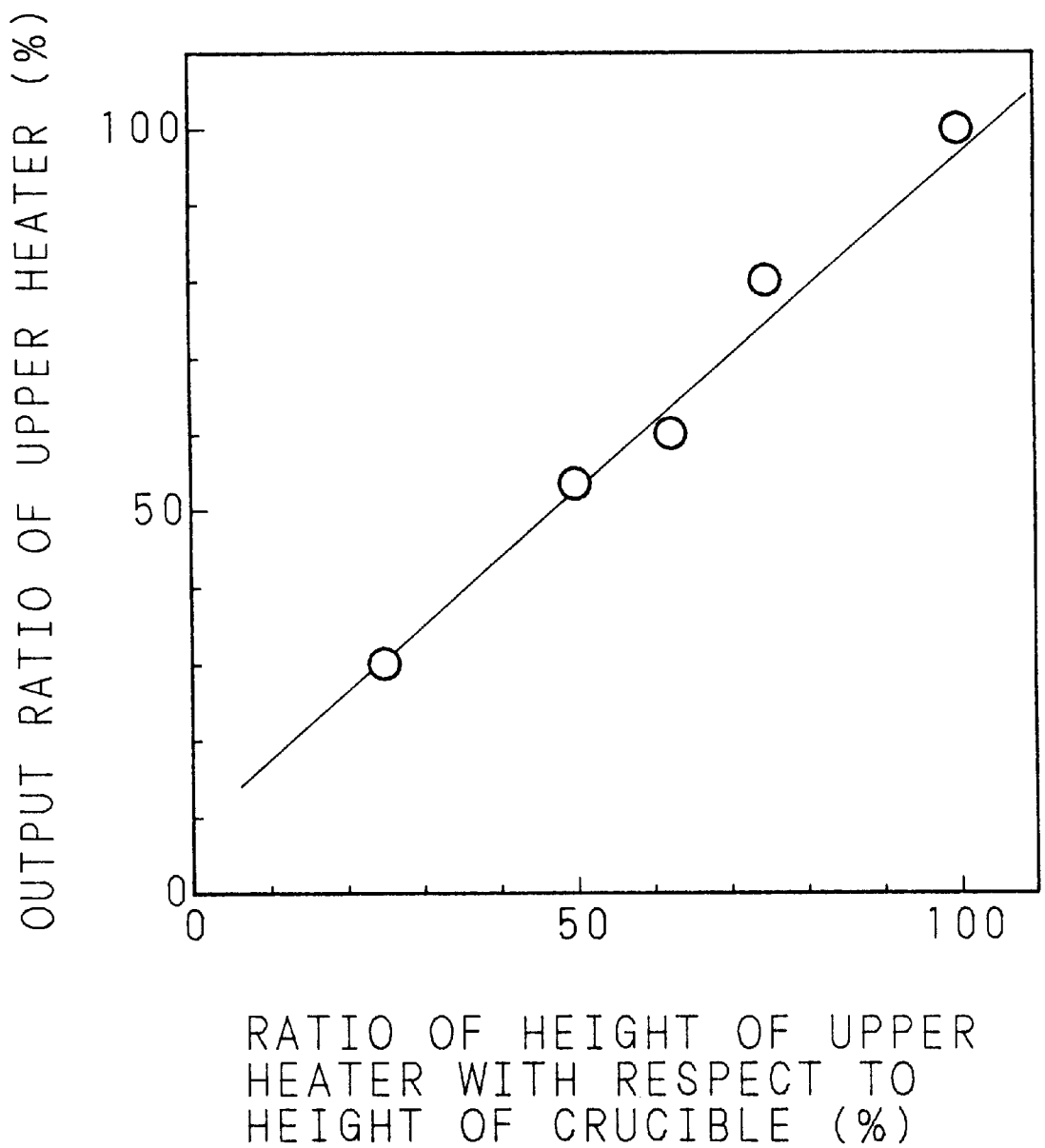
FIG. 2 is a graph showing an output ratio of an upper heater when a non-defective rate, which is a ratio of a required oxygen concentration region in a pulled single crystal, is 80% in the case where a ratio of a height of the upper heater with respect to a height of a crucible is changed in the single crystal pulling apparatus where heaters in upper and lower steps are provided around the crucible.

FIG. 2 is a graph showing an output ratio of an upper heater when a non-defective rate, which is a ratio of a required oxygen concentration region in a pulled single crystal, is 80% in the case where a ratio of a height of the upper heater with respect to a height of a crucible is changed in the single crystal pulling apparatus where heaters in upper and lower steps are provided around the crucible. As is clear from FIG. 2, a relationship of direct proportion holds between the output ratio and the ratio of the height. Namely, it was found that the ratio of the height of the upper heater to the height of the crucible, in other words, a size of a heating region of the upper heater with respect to the crucible and the non-defective rate are interrelative. A slope of the straight line in FIG. 2 was 0.88 in the case where non-defective rate is 80%. Therefore, when an output ratio of the upper heater is set so as to obtain a value which is not less than a value obtained by multiplying a ratio of the above-described height by 0.88, a temperature of a bottom portion of the crucible is set to be lower than that of an upper portion thereof so that an amount of oxygen eluted from the bottom of the crucible is controlled, and thus single crystal in which the non-defective rate is high can be pulled up.

Figure 3:
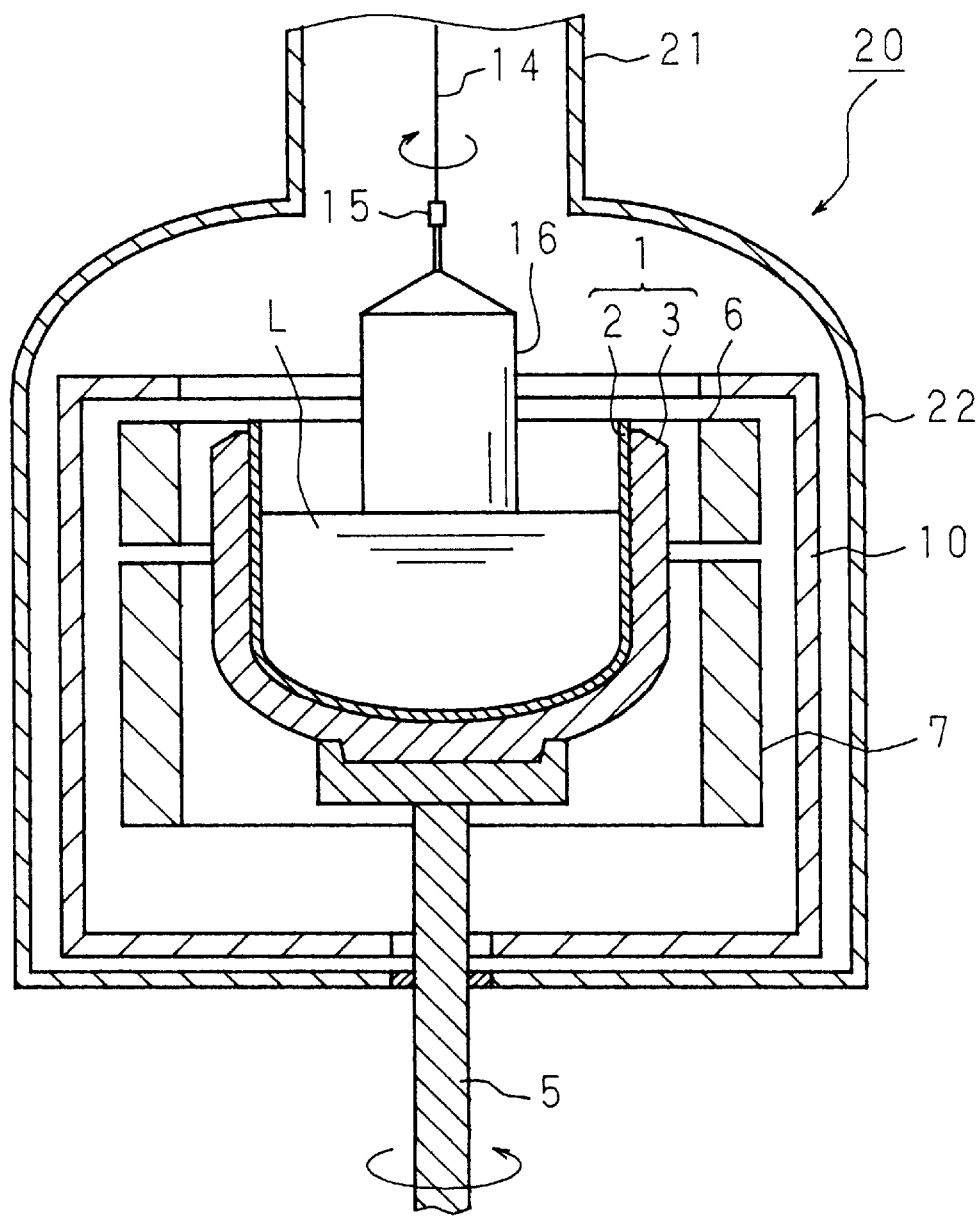
FIG. 3 is a side sectional view showing a main section of a single crystal pulling apparatus used in the method of the present invention.

FIG. 3 is a side sectional view showing a main section of the single crystal pulling apparatus used in the method of the present invention. In the drawing, 20 is a metallic chamber. The chamber 20 is arranged so that a cylindrical pull chamber 21 is connected with a main chamber 22 of wide-mouthed bottle type. A crucible 1 for melting raw material is positioned in a center of the main chamber 22. The crucible 1 is arranged so that an outer container 3 made of graphite which has the similar figure to an inner container 2 is fitted to the inner container 2 made of quartz where a bowl-shaped lower section is provided to a lower end of a cylindrical drum section. The crucible 1 is rotated and raised/lowered by a supporting member 5 made of graphite which has thermal conductivity approximately same as that of the outer container 3.

Drum-shaped heaters 6 and 7 of resistance heating type are provided on the outside of the crucible 1 so as to be separated from each other in an up-and-down direction and to be on a coaxial circle about the crucible 1. A ratio of a dimension (height) of the upper heater 6 in the up-and-down direction to a dimension (height) of the crucible 1 in the up-and-down direction is set so as to obtain a predetermined value according to target oxygen concentration and the output ratios of the heaters 6 and 7. The crucible 1 and heaters 6 and 7 are stored in an adiabatic container 10 of cylindrical shell shape. A hole whose diameter is slightly larger than a diameter of the crucible 1 is provided onto an upper surface of the adiabatic container 10, and a hole whose diameter is slightly larger than a diameter of an axis of the supporting member 5 is provided onto a bottom surface of the adiabatic container 10. The supporting member 5 penetrates the hole provided onto the bottom surface of the adiabatic container 10 and a bottom of the main chamber 22, and it is connected with a rotary elevator, not shown. Meanwhile, a bar-shaped or wire-shaped pulling shaft 14 is hung from a central axis of the pull chamber 21 so as to be freely raised/lowered and rotated, and a seed crystal 15 is attached to a lower end of the pulling shaft 14.

In order to pull up a single crystal by such an apparatus, the outputs of the heaters 6 and 7 are set to be maximum, and the raw material in the crucible 1 is melted so that molten liquid L is obtained. When the whole material is melted, the outputs of the heaters 6 and 7 are lowered so that the temperature of molten liquid L is lowered to a predetermined value. Thereafter, the seed crystal 15 is brought into contact with the surface of the molten liquid L, and in order to obtain required oxygen concentration, the output ratios of the heaters 6 and 7 are set to be a value calculated according to the following equation (1) based on a ratio $R_T$ of the height of the upper heater 6 to the height of the crucible 1. As a result, single crystal 16 where a ratio of the required oxygen concentration is high can be pulled up.

$$R_{PW} \geq 0.88 R_T \quad (1)$$

Here, $R_{PW}$: the output ratio of the upper heater

Next, while the pulling shaft 14 and supporting member 5 are being rotated in directions opposite to each other, the pulling shaft 14 is pulled up at a predetermined speed, and thus the single crystal 16 is grown in a lower position of the seed crystal 15. At this time, as the molten liquid L is decreased by pulling of the single crystal 16, the crucible 1 is raised by the supporting member 5, and a height of the surface of the molten liquid L between the upper end and lower end of the upper heater 6 is kept approximately constant.

The following describes results of conducting a comparison test.

(Embodiment 1)

Figure 4:
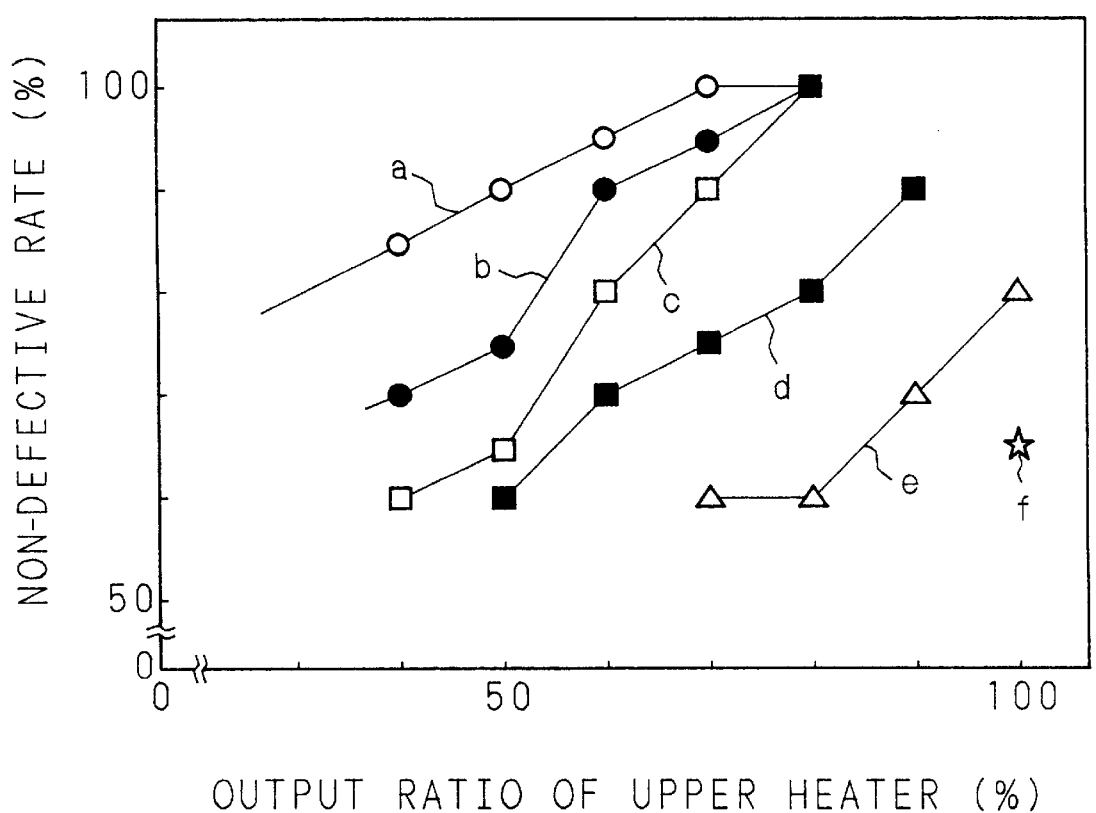
FIG. 4 is a graph showing a relationship between a height of an upper heater and a ratio of an output of the upper heater with respect to an output of a lower heater and a non-defective rate in the single crystal pulling apparatus where heaters in upper and lower steps are provided around a crucible.

FIG. 4 is a graph showing a relationship between the height of the upper heater and the ratio of the output of the upper heater with respect to the output of the lower heater and the non-defective rate in the single crystal pulling apparatus where the heaters in upper and lower steps are provided around the crucible. Here, the non-defective rate and the output ratio of the upper heater should be read along the vertical and horizontal axes, respectively. The crucible has a height of 400 mm and diameter of 590 mm, and 100 kg of raw material was melted so that single crystal of 8 inch×1000 mm was pulled up with the crucible being rotated at 10 rpm. The non-defective rate of each single crystal was obtained in a following manner. The pulled single crystal is cut in a direction which intersects perpendicularly to the longitudinal direction at intervals of 100 mm in the longitudinal direction so that a plurality of blocks are obtained. Average oxygen concentration of both end surfaces of the respective blocks is measured by FTIR (Foutier Transform Infrared) apparatus. When the measured results on both end surfaces are not more than the target oxygen concentration, the blocks pass the test, and when the results exceed the target oxygen concentration, the blocks do not pass the test. The blocks which do not pass the test are further cut at its center portion, and the oxygen concentration on both end surfaces of the cut blocks is measured. Then, a ratio of the blocks which passed the test to the single crystal is the non-defective rate.

In the graph, a represents the case where the height of the upper heater is 100 mm and the height of the lower heater is 400 mm, b represents the case where the height of the upper heater is 200 mm and the height of the lower heater is 300 mm, c represents the case where the height of the upper heater is 250 mm and the height of the lower heater is 250 mm, d represents the case where the height of the upper heater is 300 mm and the height of the lower heater is 200 mm, and e represents the case where the height of the upper heater is 400 mm and the height of the lower heater is 100 mm. Moreover, f represents a reference example, and one heater with height of 500 is provided around the crucible.

As is clear from FIG. 4, in any cases a through e, in the method of the present invention, when the output ratio of the upper heater was set to be a value which was not less than a value obtained by multiplying a ratio of a dimension of the upper heater in the up-and-down direction to a dimension of the crucible in the up-and-down direction by 0.88, single crystal in which the non-defective rate was not less than 80% could be pulled up.

(Embodiment 2)

Figure 5:
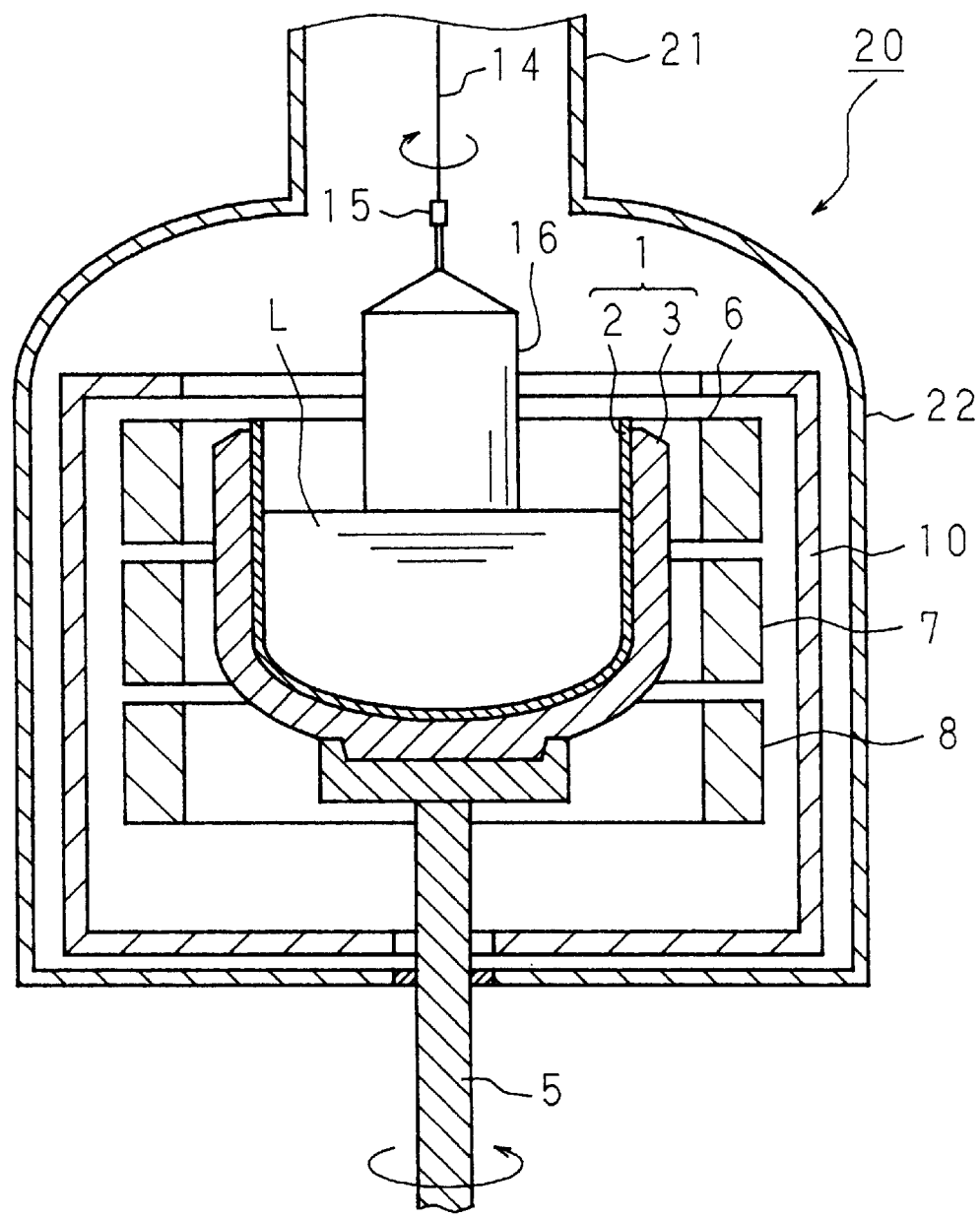
FIG. 5 is a side view showing the single crystal pulling apparatus used in the present embodiment.

FIG. 5 is a side view showing the single crystal pulling apparatus used in the present embodiment, and three heaters are provided in the up-and-down direction. Drum-shaped heaters 6, 7 and 8 are provided around the crucible 1 to be separated from each other, and the dimensions of the respective heaters 6, 7 and 8 in the up-and-down direction are 150 mm. The height of the crucible 1 is 400 mm, and the diameter is 590 mm. 100 kg of raw material was charged into the crucible 1, and after the raw material was melted by the heaters 6, 7 and 8, the outputs of the heaters 6, 7 and 8 were set to respective ratio. Then, while the crucible 1 was being rotated at 10 rpm, the single crystal 16 of 8 inch×1000 mm was pulled up, and its non-defective rate was The results are shown in Table 1.

TABLE 1

| Test No. | Heater | Output Ratio (%) | Non-defective rate (%) |
|---|---|---|---|
| 1 | Upper step | 30 | 60 |
|   | Middle step | 35 |  |
|   | Lower step | 35 |  |
| 2 | Upper step | 40 | 65 |
|   | Middle step | 30 |  |
|   | Lower step | 30 |  |
| 3 | Upper step | 50 | 75 |
|   | Middle step | 25 |  |
|   | Lower step | 25 |  |
| 4 | Upper step | 60 | 90 |
|   | Middle step | 20 |  |
|   | Lower step | 20 |  |
| 5 | Upper step | 60 | 100 |
|   | Middle step | 40 |  |
|   | Lower step | 0 |  |

As is clear from Table 1, even in the case where the heaters 6, 7 and 8 are provided in the three steps in the up-and-down direction, like the method of the present invention, when the output ratio of the upper heater 6 was set to a value which is not less than a value obtained by multiplying a ratio of the height of the upper heater 6 to the height of the crucible 1 by 0.88, single crystal in which the non-defective rate is not less than 80% could be pulled up.

Here, in FIGS. 3 and 5, the present invention is applied to the apparatus where two or three heaters are provided beside the crucible, but the present invention is not limited to this, so needless to say that the present invention can be applied also to the apparatus where the bottom heater is provided so as to face the bottom portion of the crucible. Moreover, the present invention can be applied also to the apparatus where not less than four heaters are provided.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A method of pulling up a single crystal from a molten liquid of raw material in a crucible of an apparatus having plural heaters without a solid layer of raw material in the crucible, the molten liquid having a surface height maintained in a heating region of a topmost heater of the plural heaters relative to the crucible in an up-and-down direction comprising the step of:

setting an output ratio of an output of the topmost heater relative to outputs of all the plural heaters when the crystal is being pulled to a value equal to or greater than a value resulting from a product of multiplying a height ratio of a height of the topmost heater in the up-and-down direction relative to a height of the crucible in the up-and-down direction by 0.88 to obtain a required oxygen concentration of the pulled single crystal.

2. The single crystal pulling method according to claim 1, wherein the plural heaters are drum-shaped heaters provided around the crucible.

3. The single crystal pulling method according to claim 2, wherein the number of the plural heaters is two.

4. The single crystal pulling method according to claim 2, wherein the number of the plural heaters is three.

5. A single crystal pulling method, comprising the steps of:

heating a crucible containing a raw material using plural heaters provided in an up-and-down direction relative to the crucible to melt the whole raw material;

pulling the single crystal up from a molten liquid formed from heating the whole raw material in the crucible, the molten liquid having a surface height maintained in a heating region of a topmost heater of the plural heaters; and setting an output ratio of an output of the topmost heater relative to outputs of all the plural heaters when the single crystal is being pulled to a value equal to or greater than a value resulting from a product of multiplying a height ratio of a height of the topmost heater in the up-and-down direction relative to a height of the crucible in the up-and-down direction by 0.88 to obtain a required oxygen concentration of the pulled single crystal.

6. The single crystal pulling method according to claim 5, wherein the outputs of the plural heaters during pulling of the single crystal are less than the outputs of the plural heaters during the melting of the whole raw material in the crucible.

7. The single crystal pulling method according to claim 5, wherein the plural heaters are drum-shaped heaters provided around the crucible.

8. The single crystal pulling method according to claim 7, wherein the number of the plural heaters is two.

9. The single crystal pulling method according to claim 7, wherein the number of the plural heaters is three.

* * * * *